United States Patent
Wen (10) Patent No.: US 10,264,636 B2
(45) Date of Patent: Apr. 16, 2019

(54) LIGHT SOURCE AND LIGHT EMITTING MODULE

(71) Applicant: KAISTAR Lighting (Xiamen) Co., Ltd., Xiamen (CN)

(72) Inventor: Jinfu Wen, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 16/053,664

(22) Filed: Aug. 2, 2018

(65) Prior Publication Data

US 2019/0069361 A1  Feb. 28, 2019

(30) Foreign Application Priority Data

Aug. 31, 2017 (CN) .......................... 2017 1 0775411

(51) Int. Cl.
  *H05B 33/08* (2006.01)
  *H05B 37/02* (2006.01)
  *H01L 33/36* (2010.01)

(52) U.S. Cl.
  CPC ......... *H05B 33/0827* (2013.01); *H01L 33/36* (2013.01); *H05B 33/0815* (2013.01); *H05B 37/02* (2013.01)

(58) Field of Classification Search
  CPC .............. H05B 33/08; H05B 33/0809; H05B 33/0812; H05B 33/0815; H05B 33/0818; H05B 33/0824; H05B 37/02
  See application file for complete search history.

(56) References Cited

U.S. PATENT DOCUMENTS

| | | | |
|---|---|---|---|
| 8,188,671 B2* | 5/2012 | Canter | H05B 33/0815 315/186 |
| 8,710,745 B1 | 4/2014 | Chang et al. | |
| 9,991,791 B2* | 6/2018 | Herfurth | H02M 3/157 |
| 2008/0278092 A1* | 11/2008 | Lys | H05B 33/0815 315/247 |
| 2010/0148691 A1* | 6/2010 | Kuo | H05B 33/0815 315/291 |
| 2011/0279044 A1* | 11/2011 | Maiw | H05B 33/0809 315/186 |

FOREIGN PATENT DOCUMENTS

| | | |
|---|---|---|
| CN | 206196097 U | 5/2017 |
| CN | 107046746 A | 8/2017 |

* cited by examiner

*Primary Examiner* — Thai Pham
(74) *Attorney, Agent, or Firm* — Hemisphere Law, PLLC; Zhigang Ma (57) ABSTRACT

A light source and a light emitting module thereof are provided. The light source drives and controls the light emitting module containing numerous light emitters by linear constant current drivers and a switch, and all the light emitters can be turned on or turned off simultaneously by utilizing a manner of full-balance series-parallel conversion, which result in the superior light uniformity and even the low flicker requirement can be met.

12 Claims, 6 Drawing Sheets

FIG. 7

LIGHT SOURCE AND LIGHT EMITTING MODULE

TECHNICAL FIELD

The disclosure relates to a technical field of illumination, and more particularly to a light source and a light emitting module.

DESCRIPTION OF RELATED ART

Nowadays, light emitting diode (LED) illumination products on the market primarily adopt switching mode power supplies as driving, which require large amounts of electric elements such as transformers, inductors and electrolytic capacitors. These electric elements are relatively expensive, and the service life of LED lamps is merely several-thousand hours due to the adoption of the elements such as the electrolytic capacitors, which is far less than the fifty-thousand-hour lifespan of LEDs.

SUMMARY

Accordingly, in order to conquer flaws and shortcomings in the related art, the disclosure provides a light source and a light emitting module to chase the objectives of reducing costs and enhancing the performance of products.

Specifically, a light source provided by an embodiment of the disclosure includes a switch, a first linear constant current driver and a light emitting module. The switch includes a control terminal, a first pathway terminal and a second pathway terminal; the first linear constant current driver includes a first detection terminal, a power terminal, a ground terminal, a switch control terminal and a second detection terminal. The first detection terminal is connected with a node between a first resistor and a second resistor; the first resistor and the second resistor are connected in series between a first power connection terminal and a second power connection terminal; the power terminal is connected with the first power connection terminal through a third resistor; the ground terminal is connected with the second power connection terminal; the switch control terminal is connected with the control terminal of the switch through a fourth resistor; the light emitting module is connected between the first power connection terminal and the first pathway terminal of the switch; the second pathway terminal of the switch is connected with the second power connection terminal through a fifth resistor; the second detection terminal is connected with a node between the second pathway terminal of the switch and the fifth resistor.

In an embodiment of the disclosure, the light source further includes a filter capacitor; the filter capacitor is connected between the first detection terminal and the second power connection terminal.

In an embodiment of the disclosure, the light source further includes a bridge rectifier, a fuse and a varistor; the first power connection terminal and the second power connection terminal are connected with output terminals of the bridge rectifier; a first input terminal of the bridge rectifier is connected with a first alternating current input terminal through the fuse; a second input terminal of the bridge rectifier is connected with a second alternating current input terminal, and the varistor is connected between the first alternating current input terminal and the second alternating current input terminal.

In an embodiment of the disclosure, the light emitting module includes a first light emitter group, a first discharge resistor, a second linear constant current driver, a first current-limiting resistor, a first diode, a second light emitter group, a second discharge resistor, a third linear constant current driver and a second current-limiting resistor. A current detection terminal of the second linear constant current driver is connected with a ground terminal of the second linear constant current driver and the first pathway terminal of the switch through the first current-limiting resistor; the first light emitter group and the first discharge resistor are parallel connected between an input terminal of the second linear constant current driver and the first power connection terminal. A current detection terminal of the third linear constant current terminal is connected with a ground terminal of third linear constant current terminal through the second current-limiting resistor, and further connected with a node between the first discharge resistor and the input terminal of the second linear constant current driver through the first diode; an input terminal of the third linear constant current driver is connected with the first power connection terminal; the second light emitter group and the second discharge resistor are parallel connected between the ground terminal of the third linear constant current driver and the current detection terminal of the second linear constant current driver.

In an embodiment of the disclosure, the light source further includes a sixth resistor and a seventh resistor; the first discharge resistor and the first light emitter group are parallel connected and subsequently connected with the input terminal of the second linear constant current driver through the sixth resistor; the input terminal of the third linear constant current driver is connected with the first power connection terminal through the seventh resistor.

In an embodiment of the disclosure, the light source further includes a first electrolytic capacitor and a second electrolytic capacitor; the first electrolytic capacitor, the first discharge resistor and the first light emitter group are parallel connected; the second electrolytic capacitor, the second discharge resistor and the second light emitter group are parallel connected.

In an embodiment of the disclosure, the light source further includes a second diode and a third diode. A cathode of the second diode is connected with the input terminal of the second linear constant current driver; the first electrolytic capacitor, the first discharge resistor and the first light emitter group are parallel connected between the first power connection terminal and an anode of the second diode. An anode of the third diode is connected with the ground terminal of the third linear constant current driver; the second electrolytic capacitor, the second discharge resistor and the second light emitter group are parallel connected between a cathode of the third diode and the current detection terminal of the second linear constant current driver.

In an embodiment of the disclosure, the first light emitter group includes a plurality of light emitter strings that are parallel connected, and each of the plurality of light emitter strings includes a plurality of light emitters connected in series.

In addition, an embodiment of the disclosure provides a light emitting module with a first wiring terminal and a second wiring terminal, which includes a first light emitter group, a first discharge resistor, a first linear constant current driver, a first current-limiting resistor, a first diode, a second light emitter group, a second discharge resistor, a second linear constant current driver and a second current-limiting resistor. A current detection terminal of the first linear constant current driver is connected with a ground terminal of the first linear constant current driver and the second wiring terminal through the first current-limiting resistor, the first light emitter group and the first discharge resistor are parallel connected between an input terminal of the first linear constant current driver and the first wiring terminal. A current detection terminal of the second linear constant current driver is connected with a ground terminal of the second linear constant current driver through the second current-limiting resistor, and further connected with a node between the first discharge resistor and the input terminal of the first linear constant current driver through the first diode; an input terminal of the second linear constant current driver is connected with the first wiring terminal; the second light emitter group and the second discharge resistor are parallel connected between the ground terminal of the second linear constant current driver and the current detection terminal of the first linear constant current driver.

In an embodiment of the disclosure, the light emitting module further includes a sixth resistor and a seventh resistor; the first discharge resistor and the first light emitter group are parallel connected and subsequently connected with the input terminal of the first linear constant current driver through the sixth resistor; the input terminal of the second linear constant current driver is connected with the first wiring terminal through the seventh resistor.

In an embodiment of the disclosure, the light emitting module further includes a first electrolytic capacitor and a second electrolytic capacitor; the first electrolytic capacitor, the first discharge resistor and the first light emitter group are parallel connected; the second electrolytic capacitor, the second discharge resistor and the second light emitter group are parallel connected.

In an embodiment of the disclosure, the light emitting module further includes a second diode and a third diode. A cathode of the second diode is connected with the input terminal of the first linear constant current driver; the first electrolytic capacitor, the first discharge resistor and the first light emitter group are parallel connected between the first wiring terminal and an anode of the second diode. An anode of the third diode is connected with the ground terminal of the second linear constant current driver; the second electrolytic capacitor, the second discharge resistor and the second light emitter group are parallel connected between the a cathode of the third diode and the current detection terminal of the first linear constant current driver.

In an embodiment of the disclosure, the first light emitting group includes a number of light emitter strings that are parallel connected, and each of the light emitter strings includes a number of light emitters connected in series.

It can be learnt that the embodiments of the disclosure can prolong the working time of light emitters by mutually switching two operational modes of parallel-series connection with fewer elements (e.g. without transformers) according to the structural design of circuits of the light source and the light emitting module, which further result in improving performances and reducing costs of products.

BRIEF DESCRIPTION OF THE DRAWINGS

In order to more clearly illustrate technical solutions in embodiments of the disclosure or the prior art, the drawings required in description of the embodiments or the prior art will be briefly introduced. Apparently, the described drawings below are merely some embodiments of the disclosure, and a person skilled in the art can obtain other drawings according to these drawings without any inventive work.

DETAILED DESCRIPTION OF PREFERRED EMBODIMENTS

In order to better clarify the objective, technical solutions and advantages of embodiments of the disclosure, the technical solutions in the embodiments of the disclosure will be described clearly with reference to the accompanying drawings in the embodiments of the disclosure as follows. Apparently, the described embodiments are merely some embodiments of the disclosure rather than all of the embodiments. Based on the embodiments in the disclosure, all the other embodiments obtained by a person skilled in the art without any creativity should belong to the protective scope of the disclosure.

Figure 1:
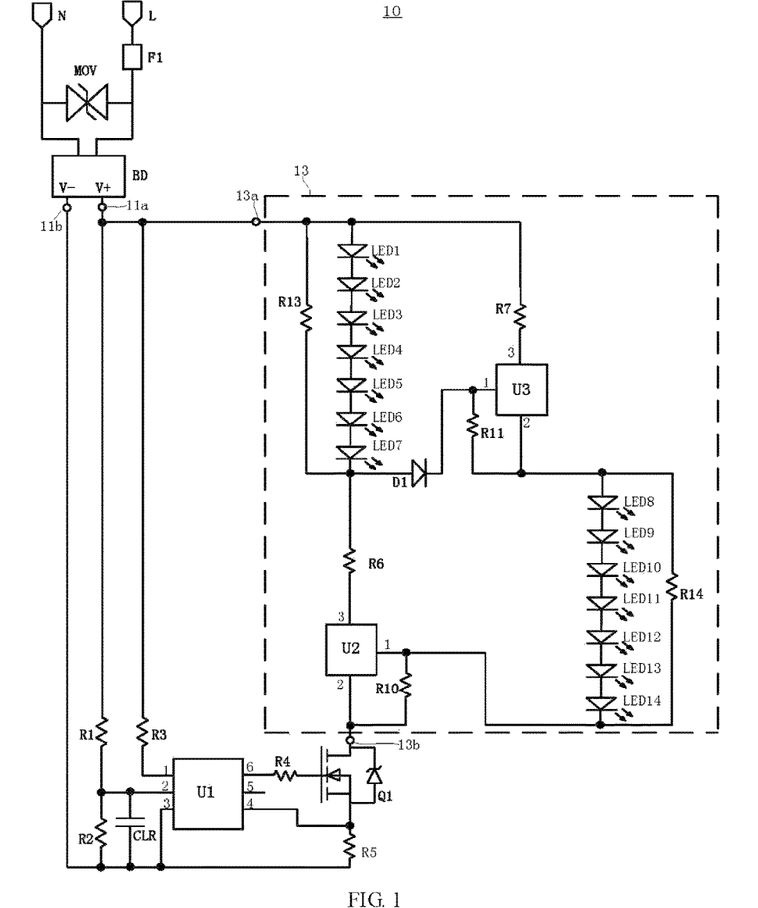
FIG. 1 is a structural schematic view of a circuit of a light source provided by an embodiment of the disclosure.

Referring to FIG. 1, an embodiment of the disclosure provides a light source 10, primarily including a switch Q1, a linear constant current driver U1 and light emitting module 13. The light emitting module 13 can be a light emitter. Auxiliary circuits such as a bridge rectifier BD, a varistor MOV and a fuse F1 are further included.

The switch Q1 includes a control terminal, a first pathway terminal and a second pathway terminal. For instance, the switch Q1 is a metal-oxide-semiconductor (MOS) transistor. A gate electrode of the MOS transistor can be the control terminal, a source electrode (or a drain electrode) of the MOS transistor can be the first pathway terminal, and the drain electrode (or the source electrode) of the MOS transistor can be the second pathway terminal. Apparently, the switch Q1 can further be replaced by other three-terminal elements, which will not be specifically restricted herein.

The linear constant current driver U1 includes a first detection terminal (pin 2), a power terminal (pin 1), a ground terminal (pin 3), a switch control terminal (pin 6) and a second detection terminal (pin 4). The first detection terminal (pin 2) is connected with a node between a resistor R1 and a resistor R2; the resistor R1 and the resistor R2 are connected in series between a power connection terminal 11a and a power connection terminal 11b, and the first detection terminal (pin 2) further is connected with the power connection terminal 11b through a filter capacitor CLR. The power terminal (pin 1) is connected with the power connection terminal 11a through a resistor R3. The ground terminal (pin 3) is connected with the power connection terminal 11b. The switch control terminal (pin 6) is connected with the control terminal of the switch Q1 through a resistor R4. A wiring terminal 13a of the light emitting module 13 is connected with the power connection terminal 11a, a wiring terminal 13b of the light emitting module 13 is connected with the first pathway terminal of the switch Q1, and the light emitting module 13 consequently is connected between the power connection terminal 11a and the first pathway terminal of the switch Q1. The second pathway terminal of the switch Q1 is connected with the power connection terminal 11b through a resistor R5.

The second detection terminal (pin 4) is connected with a node between the second pathway terminal of the switch Q1 and a resistor R5.

The light emitting module 13 includes light emitter group LED1~LED7, a discharge resistor R13, a linear constant current driver U2, a current-limiting resistor R10, a diode D1, light emitter group LED8~LED14, a discharge resistor R14, a linear constant current driver U3 and a current-limiting resistor R11.

A current detection terminal (pin 1) of the linear constant current driver U2 is connected with a ground terminal (pin 2) of the linear constant current driver U2 through the current-limiting resistor R10. The light emitter group LED1~LED7 and the discharge resistor R13 are parallel connected. The parallel connected light emitter group LED1~LED7 and the discharge resistor R13 are connected in series with a resistor R6, which are between an input terminal (pin 3) of the linear constant current driver U2 and the power connection terminal 11*a*.

A current detection terminal (pin 1) of the linear constant current driver U3 is connected with a ground terminal (pin 2) of the linear constant current driver U3 through the current-limiting resistor R11. The pin 1 is connected with a node between the discharge resistor R13 and the resistor R6 connected with the input terminal (pin 3) of the linear constant current driver U2 through the diode D1. An input terminal (pin 3) of the linear constant current driver U3 is connected with the power connection terminal 11*a* through a resistor R7. The light emitter group LED7~LED14 and the discharge resistor R14 are parallel connected between the ground terminal (pin 2) of the linear constant current driver U3 and the current detection terminal (pin 1) of the linear constant current driver U2.

The power connection terminal 11*a* and the power connection terminal 11*b* are connected with the output terminals of the bridge rectifier BD. One input terminal of the bridge rectifier BD is connected with an alternating current input terminal L through the fuse F1, the other input terminal of the bridge rectifier BD is connected with an alternating current input terminal N. The varistor MOV is connected between the alternating current input terminal L and the alternating current input terminal N. As an example, the varistor MOV of the embodiment is a metal-oxide varistor. Apparently, in other embodiments, the bridge rectifier BD can further be replaced by other rectifiers, such as a full-wave rectifier, even a half-wave rectifier.

In brief, the circuit connective relation of the light source 10 of the embodiment can adopt the non-isolated power design. The alternating current input terminal L is connected in series with the fuse F1 to guarantee the safety of the circuit, which can fuse to cut off the circuit during the short circuit. The varistor MOV is connected between the alternating current input terminals L and N to protect the light emitting module 13 and the linear constant current driver U1 when any surge voltage or lightning stroke occurs in the electrical grid, which can reduce the destruction. The following connection is the bridge rectifier BD. An anode (V+) of the bridge rectifier BD is connected with the resistor R3 to provide an operational voltage to the linear constant current driver U1. The anode (V+) of the bridge rectifier BD further is connected with a bleeder circuit consisting of R1 and R2, which is connected with the first detection terminal (aka voltage detection terminal, pin 2) of the linear constant current driver U1 to play a role in keeping the power constant when the external input voltage surges. The filter capacitor CLR is parallel connected with the resistor R2. The anode (V+) of the bridge rectifier BD connected with the light emitter group LED1~LED7 are connected in series with the resistor R6, which are further connected with the linear constant current driver U2. Moreover, the sequentially connected anode (V+) of the bridge rectifier BD, the resistor R7 and linear constant current driver U3 are connected in series with the light emitter group LED8~LED14, which are further connected with the linear constant current driver U2. An end of the light emitter group LED1~LED7 further employs the diode D1 that acts as the bridge to connect the linear constant current driver U3. The linear constant current driver U2 finally is connected back with a cathode (V−) of the bridge rectifier BD through the switch Q1 such as the MOS transistor. The switch Q1 such as the MOS transistor is connected with the linear constant current driver U1 through the resistor R4. The linear constant current drivers U1, U2 and U3 respectively are connected with the resistors R5, R10 and R11 to keep the current of light emitter group LED1~LED7 and LED8~LED 14 constant. The light emitter group LED1~LED7 and LED8~LED14 respectively are parallel connected with the discharge resistors R13 and R14, which are configured to discharge the light emitter group LED1~LED7 and LED8~LED14.

Figure 2:
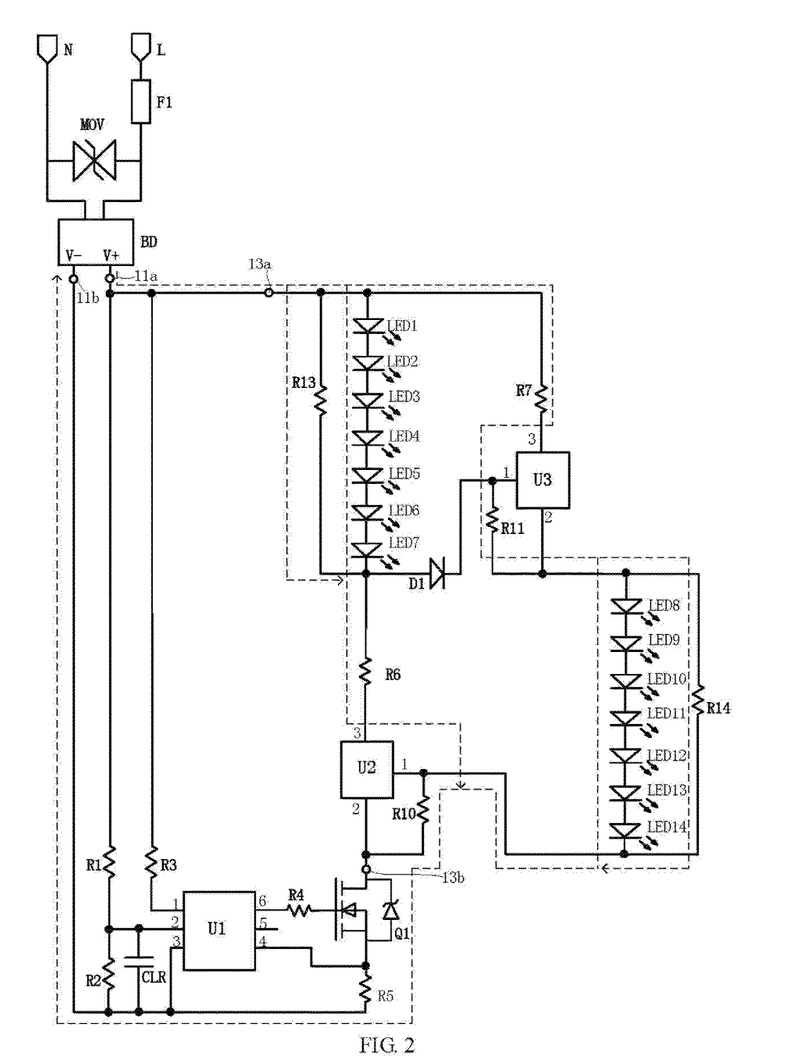
FIG. 2 and FIG. 3 are schematic views of work modes of the light source shown in FIG. 1.
Figure 3:
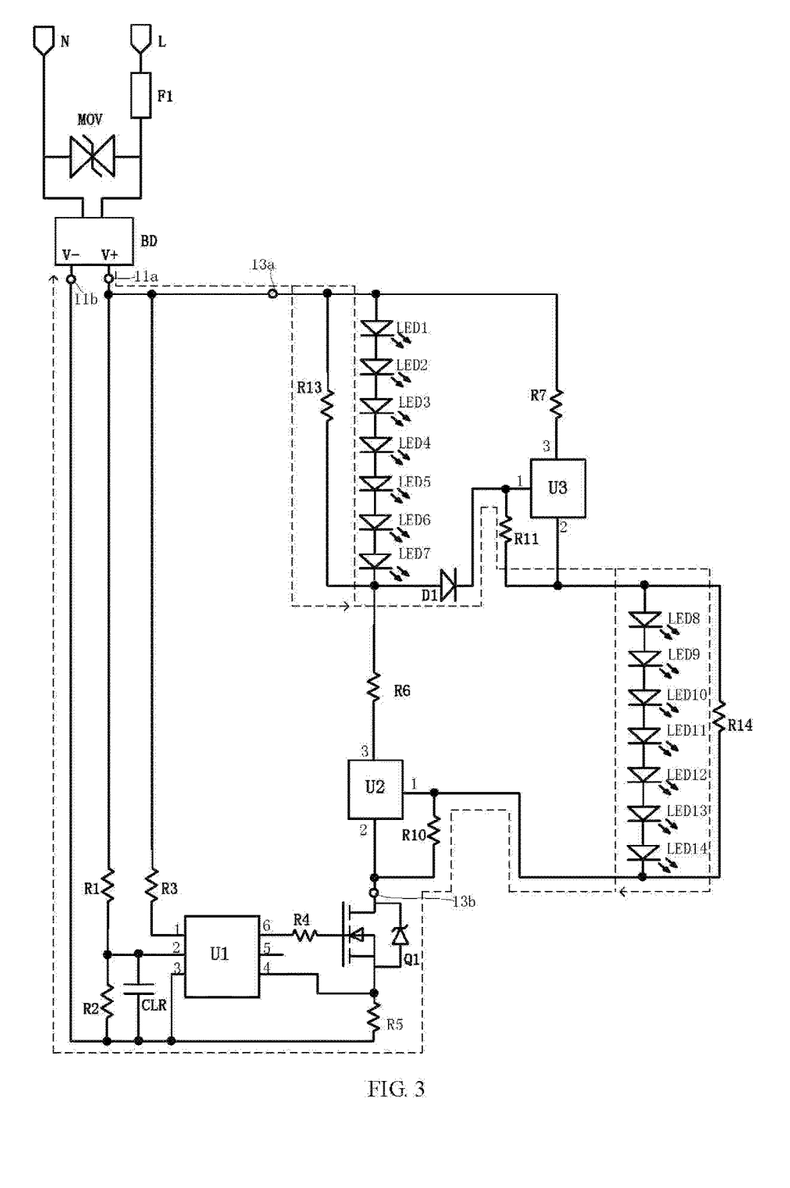

In order to better understand the embodiment, the operational principle of the light source 10 of the embodiment will be illustrated in detail with reference to FIG. 2 and FIG. 3 as follows.

When an alternating current (AC) voltage is input from the alternating current input terminals L and N, the AC voltage is rectified by the bridge rectifier BD to form a half-sine wave absolute in the positive half cycle, which gradually rises from zero voltage along with the sine wave voltage. When the voltage is raised up to the minimal conductive voltage of the seven light emitters of the light emitter group LED1~LED7 such as LEDs, the current through the linear constant current driver U3 (U2) is lower than or equal to the predetermined current of the current-limiting resistor R11 (R10). The pin 1 and the pin 3 of each of the linear constant current drivers U3/U2 are thoroughly turned on, consequently, the cathode voltage of the diode D1 is equal to the input voltage, the cathode voltage of the diode D1 is equal to the input voltage subtracted by the total voltage drop of the seven light emitters in the light emitter group LED1~LED7, which results in the cut-off state of the diode D1 because the anode voltage is lower than the cathode voltage. Therefore, the current of the light emitter group LED1~LED7 can merely pass through the pathway where the resistor R6 and the linear constant current driver U2 thereon; the current of the light emitter group LED8~LED14 will pass through the pathway where the linear constant current driver U3 and the resistor R7 thereon. Additionally, the linear constant current driver U1 fails to be up to the predetermined current, and the switch Q1 is thoroughly turned on. Therefore, the light emitter group LED1~LED7 and the light emitter group LED8~LED14 are turned on due to the passage of current by the switch Q1. The light emitter group LED1~LED7 and the light emitter group LED8~LED14 are parallel connected, and the maximal operational current in the period is equal to the limiting current set by the current-limiting resistor R11. The relative current flow paths are shown by dashed lines in FIG. 2.

Subsequently, along with the continuous rise of the input voltage, when the input voltage starts to be larger than the total voltage drop of the 14 light emitters in the light emitter group LED1~LED7 and the light emitter group LED8~LED14, the anode voltage (which is the input voltage subtracted by the total voltage drop of the light emitter group LED1~LED7) of the diode D1 will be larger than the cathode voltage (which is the total voltage drop of the light emitter group LED8~LED14) of the diode D1, and the diode D1 is turned on. Therefore, the current will pass through the light emitter group LED1~LED7, the diode D1, the light emitter group LED8~LED18 and the linear constant current driver U2. The light emitter group LED1~LED7 and the light emitter group LED8~LED14 are working under the series connection mode. When the current keeps increasing along with the input voltage up to higher than the limiting current of the linear constant current drivers U2/U3, the linear constant current drivers U2/U3 are open circuits. The linear constant current driver U1 starts to work, the current is kept to be that set by R5, and the switch Q1 is continuously turned on. The light emitter group LED1~LED7 and the light emitter group LED8~LED14 ultimately are connected in series by the switch Q1. The relative current paths are shown as dashed lines in FIG. 3.

Figure 4:
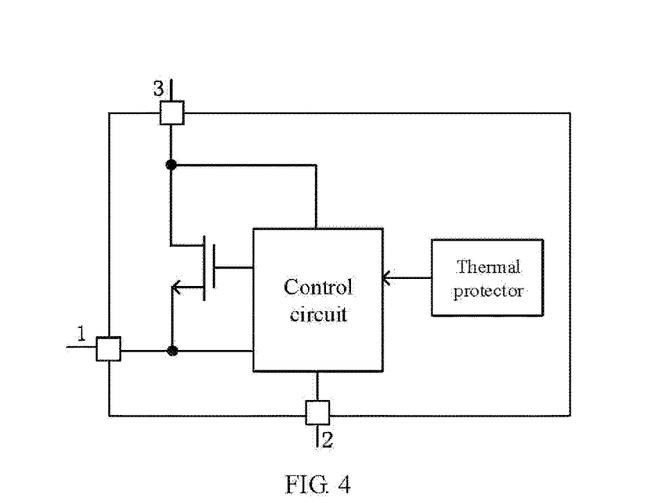
FIG. 4 is a structural schematic view of an internal circuit of linear constant current drivers U2 and U3 shown in FIG. 1.

Furthermore, the structure of the internal circuit of the linear constant current drivers U2 and U3 in FIG. 1 is as shown in FIG. 4. Specifically, the internal circuit of the linear constant current driver U2/U3 includes a switch such as the MOS transistor, a control circuit and a thermal protector; the pin 1 therein acted as the current detection terminal is externally connected with the current-limiting resistor, the pin 2 as the ground terminal, and the pin 3 as the input terminal of the power/current. The current controlled by the linear constant current driver U2/U3 shown in FIG. 4 can be 10 mA~250 mA. U2 and U3 further have the temperature protection function. For instance, when the temperature is over 125 degree Celsius, U2 and U3 can reduce the current to protect the system from being damaged due to the over-high temperature. As an example, the linear constant current drivers U2 and U3 of the embodiment can adopt linear constant current driver chips whose mode is iML8686 manufactured by Integrated Memory Logic Limited registered in Taiwan, but the disclosure will not be restricted thereto.

Figure 5:
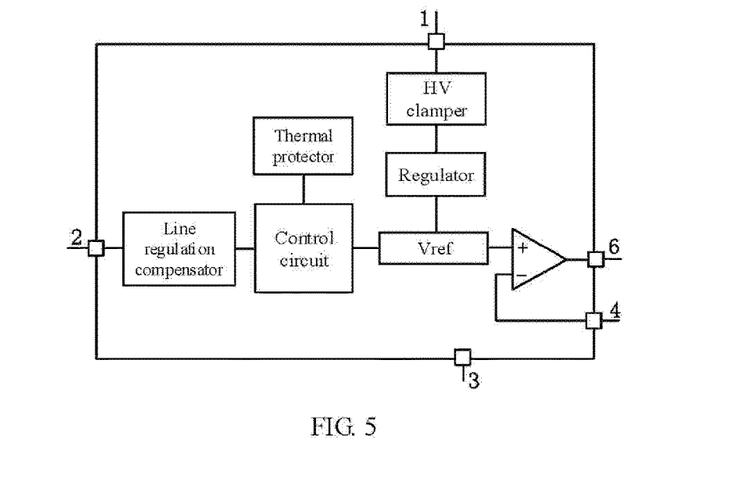
FIG. 5 is a structural schematic view of an internal circuit of a linear constant current driver U1 shown in FIG. 1.

The structure of the internal circuit of the linear constant current driver U1 in FIG. 1 can be shown as in FIG. 5. Specifically, the internal circuit of the linear constant current driver U1 includes a high voltage (HV) clamper, a regulator, a reference voltage, a line regulation compensator, a control circuit, a thermal protector and a comparer; the pin 1 thereof acts as the power terminal, the pin 2 acts as the linear regulation detection terminal, the reference voltage is adjusted according to the input of pin 2 so as to provide the line regulation compensation and the over voltage protection, the pin 3 acts as the ground terminal, the pin 4 acted as the current detection terminal is externally connected with the current-limiting resistor, and the pin 6 acts as the output control terminal (aka switch control terminal). The liner constant current driver U1 shown in FIG. 5 implements the current limitation by controlling the switch Q1 (referring to FIG. 1) such as the MOS transistor, includes functions of the over temperature protection and the line regulation, which can keep the current constant when the input voltage changes. As an example, the linear constant current driver U1 of the embodiment can adopt linear constant current driver chips whose mode is iML8690 manufactured by Integrated Memory Logic Limited registered in Taiwan, but the disclosure will not be restricted thereto.

In the embodiment, the light emitter group LED1~LED7 and the light emitter group LED8~LED14 are parallel connection and lit up at the low input voltage; the light emitter group LED1~LED7 and the light emitter group LED8~LED14 are series connection and lit up at the high input voltage; the working time of the light emitters can be elongated by mutually shifting two operational modes of parallel-series connection, which can enhance the power factor of light source products and reduce the total harmonic distortion of products, and the power factor can approach 1. Moreover, as the manner of full-balance series-parallel conversion is employed, the light emitter group LED1~LED7 and the light emitter group LED8~LED14 can be turned on or turned off simultaneously; compared with the uneven brightness problem cause by other sectional turn-on technologies, the light uniformity of the embodiment is excellent, which can approach 100%. Moreover, superior electromagnetic interference (EMI) properties are included due to the absence of parts such as large-sized capacitors and inductors. Additionally, direct connection with the national grid is applicable.

Figure 6:
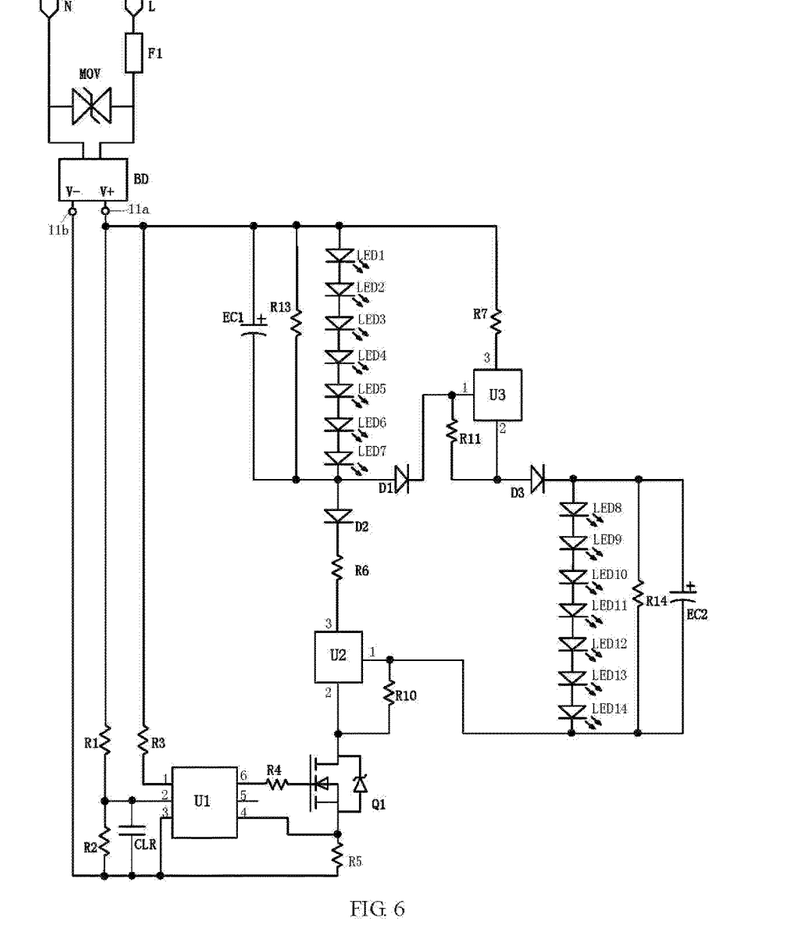
FIG. 6 is a structural schematic view of a circuit of a light source provided by another embodiment of the disclosure.
Figure 7:
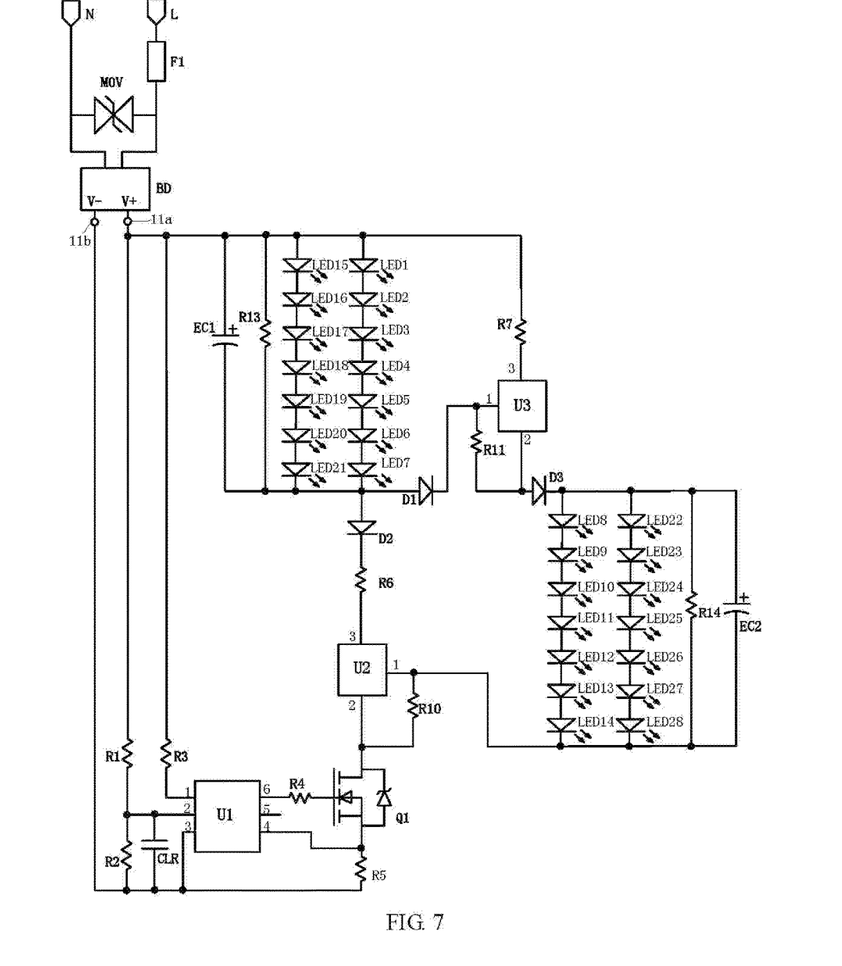
FIG. 7 is a structural schematic view of a circuit of a light source provided by still another embodiment of the disclosure.

Referring to FIG. 6, in order to achieve the low stroboscopic effect, electrolytic capacitors EC1 and EC2 are added in the circuit structure of the light source 10 shown in FIG. 1. The electrolytic capacitor EC1, the discharge resistor R13 and the light emitter group LED1~LED7 are parallel connected. The electrolytic capacitor EC2, the discharge resistor R14 and the light emitter group LED8~LED14 are parallel connected; the larger the capacitance of the electrolytic capacitors EC1 and EC2, the lower the flicker will be; the withstand voltage should be higher than the total voltage of the light emitter group. When the input sine wave voltage is relatively low, the energy stored in the electrolytic capacitors EC1 and EC2 can be respectively sent to the light emitter group LED1~LED7 and light emitter group LED8~LED14 for providing constant operational current, which can achieve the continuous work of the light emitters in the light emitter group LED1~LED7 and the light emitter group LED8~LED14, namely meeting the requirement on low stroboscopic products.

Furthermore, in the circuit structure of the light source shown in FIG. 6, diodes D2 and D3 are further added to prevent the voltage on the electrolytic capacitors EC1 and EC2 from discharging through other circuits except the light emitter group LED1~LED7 and the light emitter group LED8~LED14. Moreover, the resistors R6 and R7 shown in FIG. 1 and FIG. 6 are reserved resistors for the ring wave test, which can reduce the effect on the linear constant current drivers U2 and U3 passing through the ring wave.

Moreover, the light emitter group LED1~LED7 and the light emitter group LED8~LED14 are not restricted to a light emitter string, which can include multiple parallel connected light emitter strings, such as the light emitter group LED1~LED7 and LED15~21 are two parallel connected light emitter strings; the light emitter group LED8~LED14 and LED22~28 are two parallel connected light emitter strings.

The embodiments of the disclosure utilize the full-balance series-parallel conversion manner. Two light emitter group preferably have the same number of light emitters, such as each of the light emitter group has one or more parallel connected light emitter strings, and the light emitter strings have the same number of light emitters. For instance, the LED strings have the same number of LEDs. Moreover, the light source in the embodiments related to FIG. 1 and FIG. 6 of the disclosure can be applied in various illumination products such as downlights. For instance, fourteen 9V-1 W LEDs are divided into two group, each group includes seven connected in series LEDs to produce a 120V-10 W downlight.

The above description illustrates preferred embodiments of the disclosure rather than any limitation. Even though the preferred embodiments are disclosed above, the disclosure should not be restricted thereto. For those skilled persons in the art, various modifications and equivalent embodiments can be obtained according to the technical contents disclosed above. It is intended to cover the modifications and equivalences derived from the spirit and scope of the disclosure in the protect scope of the technical solutions of the disclosure.

What is claimed is:

1. A light source comprising:
   a switch, comprising a control terminal, a first pathway terminal and a second pathway terminal;
   a first linear constant current driver, comprising a first detection terminal, a power terminal, a ground terminal, a switch control terminal and a second detection terminal; and
   a light emitting module;
   wherein the first detection terminal is connected with a node between a first resistor and a second resistor, the first resistor and the second resistor are connected in series between a first power connection terminal and a second power connection terminal, the power terminal is connected with the first power connection terminal through a third resistor, the ground terminal is connected with the second power connection terminal, the switch control terminal is connected with the control terminal of the switch through a fourth resistor, the light emitting module is connected between the first power connection terminal and the first pathway terminal of the switch, the second pathway terminal of the switch is connected with the second power connection terminal through a fifth resistor; the second detection terminal is connected with a node between the second pathway terminal of the switch and the fifth resistor;
   wherein the light emitting module comprises a first light emitter group, a first discharge resistor, a second linear constant current driver, a first current-limiting resistor, a first diode, a second light emitter group, a second discharge resistor, a third linear constant current driver and a second current-limiting resistor;
   wherein a current detection terminal of the second linear constant current driver is connected with a ground terminal of the second linear constant current driver and the first pathway terminal of the switch through the first current-limiting resistor, the first light emitter group and the first discharge resistor are parallel connected between an input terminal of the second linear constant current driver and the first power connection terminal;
   wherein a current detection terminal of the third linear constant current terminal is connected with a ground terminal of third linear constant current terminal through the second current-limiting resistor, and further connected with a node between the first discharge resistor and the input terminal of the second linear constant current driver through the first diode; an input terminal of the third linear constant current driver is connected with the first power connection terminal, the second light emitter group and the second discharge resistor are parallel connected between the ground terminal of the third linear constant current driver and the current detection terminal of the second linear constant current driver.

2. The light source according to claim 1, wherein the light source further comprises a filter capacitor; the filter capacitor is connected between the first detection terminal and the second power connection terminal.

3. The light source according to claim 1, wherein the light source further comprises: a bridge rectifier, a fuse and a varistor; the first power connection terminal and the second power connection terminal are connected with output terminals of the bridge rectifier, a first input terminal of the bridge rectifier is connected with a first alternating current input terminal through the fuse, a second input terminal of the bridge rectifier is connected with a second alternating current input terminal, and the varistor is connected between the first alternating current input terminal and the second alternating current input terminal.

4. The light source according to claim 1, wherein the light source further comprises a sixth resistor and a seventh resistor; the first discharge resistor and the first light emitter group are parallel connected and subsequently connected with the input terminal of the second linear constant current driver through the sixth resistor; the input terminal of the third linear constant current driver is connected with the first power connection terminal through the seventh resistor.

5. The light source according to claim 1, wherein the light source further comprises a first electrolytic capacitor and a second electrolytic capacitor; the first electrolytic capacitor, the first discharge resistor and the first light emitter group are parallel connected; the second electrolytic capacitor, the second discharge resistor and the second light emitter group are parallel connected.

6. The light source according to claim 5, wherein the light source further comprises a second diode and a third diode;
   wherein a cathode of the second diode is connected with the input terminal of the second linear constant current driver; the first electrolytic capacitor, the first discharge resistor and the first light emitter group are parallel connected between the first power connection terminal and an anode of the second diode;
   wherein an anode of the third diode is connected with the ground terminal of the third linear constant current driver; the second electrolytic capacitor, the second discharge resistor and the second light emitter group are parallel connected between a cathode of the third diode and the current detection terminal of the second linear constant current driver.

7. The light source according to claim 1, wherein the first light emitter group comprises a plurality of light emitter strings connected in parallel, and each of the plurality of light emitter strings comprises a plurality of light emitters connected in series.

8. A light emitting module having a first wiring terminal and a second wiring terminal, wherein the light emitting module comprises a first light emitter group, a first discharge resistor, a first linear constant current driver, a first current-limiting resistor, a first diode, a second light emitter group, a second discharge resistor, a second linear constant current driver and a second current-limiting resistor;
   wherein a current detection terminal of the first linear constant current driver is connected with a ground terminal of the first linear constant current driver and the second wiring terminal through the first current-limiting resistor, the first light emitter group and the first discharge resistor are parallel connected between an input terminal of the first linear constant current driver and the first wiring terminal;
   wherein a current detection terminal of the second linear constant current driver is connected with a ground terminal of the second linear constant current driver through the second current-limiting resistor, and further connected with a node between the first discharge resistor and the input terminal of the first linear constant current driver through the first diode; an input terminal of the second linear constant current driver is connected with the first wiring terminal, the second light emitter group and the second discharge resistor are parallel connected between the ground terminal of the second linear constant current driver and the current detection terminal of the first linear constant current driver.

9. The light emitting module according to claim 8, wherein the light emitting module further comprises a sixth resistor and a seventh resistor; the first discharge resistor and the first light emitter group are parallel connected and subsequently connected with the input terminal of the first linear constant current driver through the sixth resistor; the input terminal of the second linear constant current driver is connected with the first wiring terminal through the seventh resistor.

10. The light emitting module according to claim 8, wherein the light emitting module further comprises a first electrolytic capacitor and a second electrolytic capacitor; the first electrolytic capacitor, the first discharge resistor and the first light emitter group are parallel connected; the second electrolytic capacitor, the second discharge resistor and the second light emitter group are parallel connected.

11. The light emitting module according to claim 10, wherein the light emitting module further comprises a second diode and a third diode;
   wherein a cathode of the second diode is connected with the input terminal of the first linear constant current driver; the first electrolytic capacitor, the first discharge resistor and the first light emitter group are parallel connected between the first wiring terminal and an anode of the second diode;
   wherein an anode of the third diode is connected with the ground terminal of the second linear constant current driver; the second electrolytic capacitor, the second discharge resistor and the second light emitter group are parallel connected between the a cathode of the third diode and the current detection terminal of the first linear constant current driver.

12. The light emitting module according to claim 8, wherein the first light emitting group comprises a plurality of light emitter strings connected in parallel, and each of the plurality of light emitter strings comprises a plurality of light emitters connected in series.

* * * * *